United States Patent

Becke et al.

[15] 3,659,334

[45] May 2, 1972

[54] HIGH POWER HIGH FREQUENCY DEVICE

[72] Inventors: Hans W. Becke, Morristown; Eric F. Cave, Somerville; Daniel Stalnitz, Raritan, all of N.J.

[73] Assignee: RCA Corporation

[22] Filed: Oct. 13, 1970

[21] Appl. No.: 80,415

Related U.S. Application Data

[62] Division of Ser. No. 738,343, June 19, 1968, abandoned.

[52] U.S. Cl. ....................................29/580, 29/590, 156/306

[51] Int. Cl. ..........................................B01j 17/00, H01l 5/00

[58] Field of Search .................29/576 J, 580, 589, 590, 591; 156/306, 281

[56] References Cited

UNITED STATES PATENTS

| | | | |
|---|---|---|---|
| 3,114,865 | 12/1963 | Thomas | 317/235 X |
| 3,260,900 | 7/1966 | Shombert | 317/235 X |
| 3,383,760 | 5/1968 | Shartzman | 29/576 UX |

*Primary Examiner*—John F. Campbell
*Assistant Examiner*—W. Tupman
*Attorney*—Glenn H. Bruestle

[57] ABSTRACT

A high power frequency device such as a thyristor or transistor comprises a monolithic body consisting of an emitter assemblage laminated to a base-collector assemblage. The emitter assemblage is a semiconductive wafer of given conductivity type having a plurality of mesas adjacent one surface; a high resistivity ballast layer in each mesa; an insulating film on said one surface and around each mesa; and a layer of high conductivity material, such as heavily doped semiconductive material of opposite conductivity type, on said insulating film over said one surface and surrounding said mesas, the surface of said high conductivity layer being co-planar with the top of said mesas. The base-collector assemblage is a semiconductive wafer which includes at least two layers of mutually opposite conductivity types, the surface of one layer being planar and constituting a major surface of said body.

3 Claims, 12 Drawing Figures

INVENTORS
HANS BECKE,
ERIC F. CAVE AND
DANIEL STOLNITZ

BY W. S. Hill
AGENT

INVENTORS
HANS BECKE,
ERIC F. CAVE AND
DANIEL STOLNITZ

BY W. S. Hill
AGENT

INVENTORS
HANS BECKE,
ERIC F. CAVE AND
DANIEL STOLNITZ

BY W. S. Hill
AGENT

INVENTORS
HANS BECKE,
ERIC F. CAVE AND
DANIEL STOLNITZ

BY N. S. Hill
AGENT

HIGH POWER HIGH FREQUENCY DEVICE

This is a division of application Ser. No. 738,343, filed June 19, 1968, now abandoned.

BACKGROUND OF THE INVENTION

1. FIELD OF THE INVENTION

This invention relates generally to improved semiconductor devices such as transistors and thyristors, and improved methods of fabricating them.

2. DESCRIPTION OF THE PRIOR ART

It is known that high frequency high power transistors can be made by laminating two semiconductive bodies, one body consisting of N type and P type layers of semiconductive material, and the other body being itself a laminate of alternate strips of P type and N type semiconductive material bonded together by an electrical insulator. For a detailed description of such a laminated strip transistor, see U.S. Pat. No. 3,355,636, issued on Nov. 28, 1967 to H. Becke, E. F. Cave, and D. Stolnitz. Although satisfactory transistors have been made in this manner, further improvement in the power output and high frequency cutoff of transistors is desirable. It is also desirable to obtain improved resistance to second breakdown, such as is available in overlay transistors. For a detailed description of overlay transistors, see D. R. Carley, "A Worthy Challenger for RF Power Honors", ELECTRONICS, Vol. 41, No. 4, pp. 98–102, Feb. 19, 1968.

SUMMARY OF THE INVENTION

The device comprises a monolithic semiconductive body which is a laminate of an emitter assemblage and a base-collector assemblage. The emitter assemblage consists of a given conductivity type semiconductive wafer having a plurality of mesas extending from one surface; an electrically insulating film on said one surface and around each said mesa; and a layer of high conductivity material on said one surface cover said insulating film and surrounding said mesas. The base-collector assemblage is a semiconductive wafer which includes at least one each of at least two layers of mutually opposite conductivity types, i.e., N type and P type layers. A high resistivity layer may be included in each mesa.

The device may be fabricated by forming a plurality of mesas on one surface of a first semiconductive wafer; forming an electrically insulating film on said one surface and on each said mesa; depositing a layer of high conductivity material on said one surface over said insulating film covering all said mesas; removing the surface of said high conductivity layer until the tops of said mesas are exposed; laminating said first semiconductive wafer to a second semiconductive wafer which includes at least two layers of mutually opposite conductivity types; and attaching electrical connections to the laminate.

THE DRAWING

Figure 1:
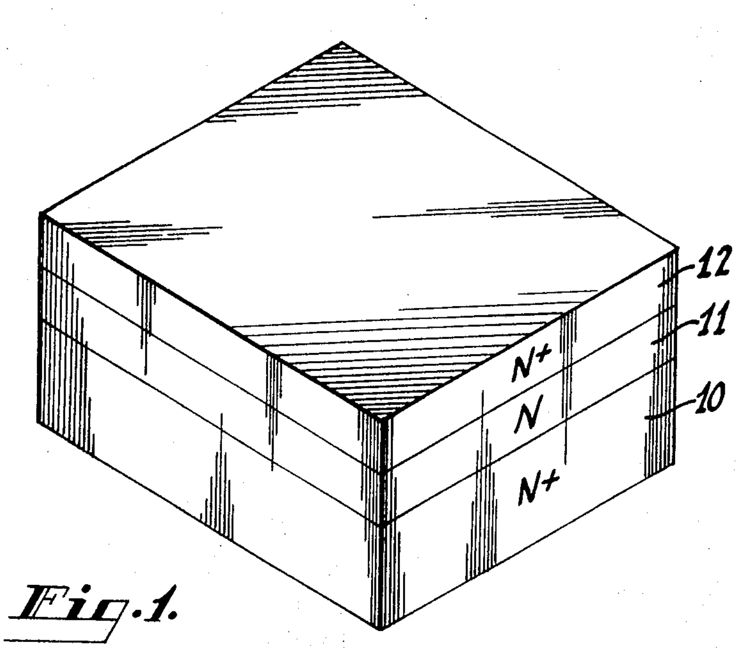
FIGS. 1 and 2 are isometric views.

The drawing is not to scale, the vertical dimensions being exaggerated for greater clarity,

DESCRIPTION OF THE PREFERRED EMBODIMENTS

EXAMPLE I

A crystalline semiconductive wafer 10 (FIG. 1) is prepared from high conductivity type material. The precise size, shape, composition and conductivity type of wafer 10 is not critical. In this example, wafer 10 consists of N+ conductivity type monocrystalline silicon; is about 5 to 8 mils thick; and has a resistivity of about 0.01 to 0.1 ohm-cm. The terms N+ and P+ are used herein to denote heavily doped N type and P type semiconductors respectively. Covering one surface of wafer 10 is a layer 11 of high resistivity material. Layer 11 suitably consists of a lightly doped semiconductor of the same conductivity type as wafer 10. In this example, layer 11 consists of epitaxially deposited monocrystalline N type silicon having a resistivity of about 5 to 50 ohm-cm. Over layer 11 is another layer 12 consisting of heavily doped semiconductive material of the same conductivity types as the wafer 10. In this example, layer 12 consists of epitaxially deposited monocrystalline silicon having a resistivity of about 0.001 to 0.01 ohm-cm. The precise thickness of layers 11 and 12 is not critical, and is suitably about 0.1 to 2 mils. Polycrystalline material may also be used for the entire structure.

A semiconductive structure such as that illustrated in FIG. 1 may be prepared by other methods, for example, by diffusing a conductivity modifier into opposite major faces of a high resistivity semiconductive wafer, or by a combination of diffusion techniques and epitaxial deposition.

Figure 2:
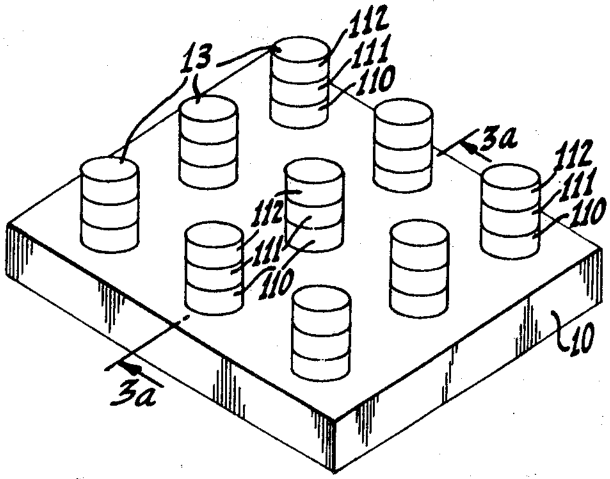
Figure 3A:
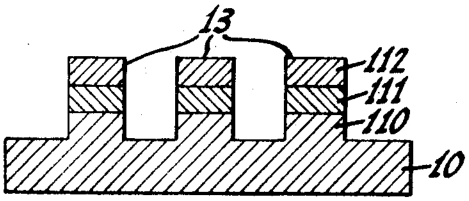
FIGS. 3*a*–3*d* and 4–6 are sectional views of semiconductive wafers during successive steps in the fabrication of a semiconductor device according to one embodiment of the invention.

A plurality of mesas 13 (FIG. 2) are formed by any convenient method, such as by spark erosion, masking and etching, or ultrasonic grinding, in that surface of wafer 10 which is covered by layers 11 and 12. All of layers 11 and 12 are removed, except for those portions of these layers which are a part of the mesas 13. A portion of wafer 10 external to each mesa 13 is also removed. Each mesa 13 thus consists of a bottom portion 110 consisting of the high conductivity material of wafer 10; a central portion 111 consisting of the high resistivity material of layer 11; and an upper portion 112 consisting of the high conductivity material of layer 12. The precise number and arrangement of the mesas, as well as their size and shape, is not critical. While the mesas 13 are shown as cylindrical in FIG. 2, mesas may also be fabricated having square or triangular or irregular cross sections. FIG 3*a* is a sectional view of the wafer 10 as in FIG. 2 along the line 3*a*–3*a*.

Figure 3B:
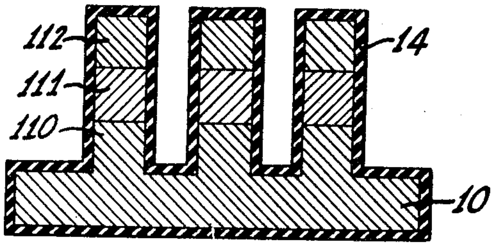

A film 14 (FIG. 3*b*) of insulating material is next formed by any convenient method over the surface of the wafer 10 and also over the surface of each mesa 13. The insulating film 14 may for example consist of silicon oxide, silicon nitride, aluminum oxide, or the like. When the wafer 10 consists of silicon, the insulating film 14 may consist of silicon dioxide formed by thermal oxidation of the wafer in an oxidizing ambient. Alternatively, a film of silicon dioxide may be deposited from the vapor phase over the wafer 10 and the mesas 13 by the pyrolytic decomposition of a siloxane compound, as described in U.S. Pat. No. 3,114,663, issued to J. Klerer on Dec. 17, 1963. Alternatively, a combination of two or more suitable insulating materials may be utilized.

Figure 3C:
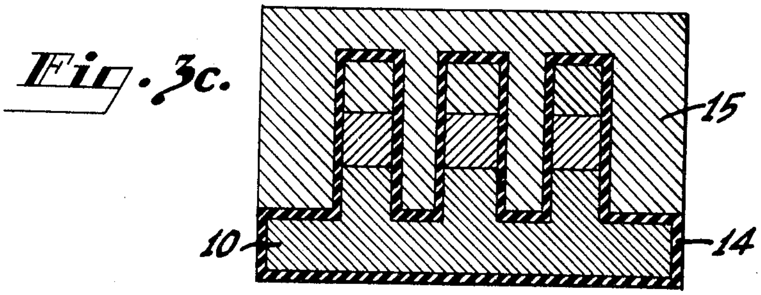

A relatively thick layer 15 (FIG. 3*c*) of high conductivity material is now deposited on the mesa-bearing surface of wafer 10 so as to completely cover that surface and surround all of the mesas 13. Suitably, the coating 15 consists of a heavily doped high conductivity polycrystalline semiconductor. In this example, layer 15 consists of polycrystalline P+ conductivity type silicon having a resistivity of about 0.001 to 0.01 ohm-cm. The thickness of layer 15 is greater than the height of the mesas 13. The polycrystalline silicon layer 15 may be deposited by standard techniques known to the art, such as by close spaced evaporation or by chemical transport.

Figure 3D:
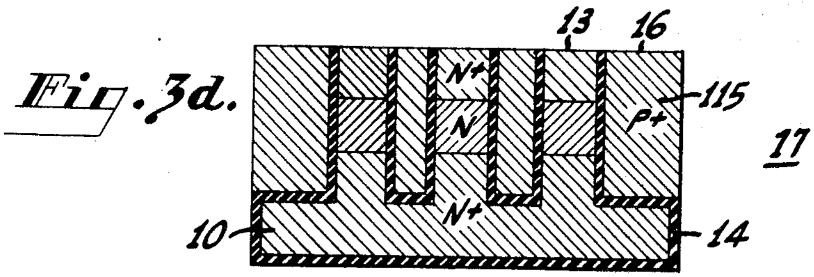

Referring now to FIG. 3*d*, the upper portion polycrystalline layer 15 is removed, for example by etching or lapping, so that the remaining portion 115 of the layer has its top surface 16 co-planar with the exposed top surface of each mesa 13. Each mesa 13 is insulated from the high conductivity material of layer 115 by the insulating film 14. The wafer 17 thus fabricated may be termed the emitter assemblage.

A base-collector assemblage 18 (FIG. 4) is prepared consisting of a heavily doped high conductivity N+ type monocrystalline silicon wafer 20. On one face of wafer 20 is an epitaxial layer 21 of N conductivity type silicon having a resistivity of about 1 to 100 ohm-cm. On layer 21 is an epitaxial layer 22 of P conductivity type material, which in this example consists of monocrystalline silicon, and has a conductivity of about 0.1 to 1 ohm-cm. A rectifying barrier or PN junction 24 is formed between the two layers 21 and 22 of opposite conductivity types. The structure illustrated in FIG. 4 may also be fabricated by diffusion techniques, for example, by diffusing an acceptor into one major face of an N type body, and diffusing a donor into the opposing major face of the same body.

Figure 4:
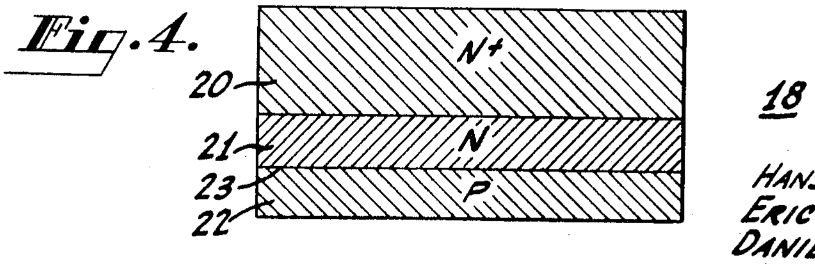
Figure 5:
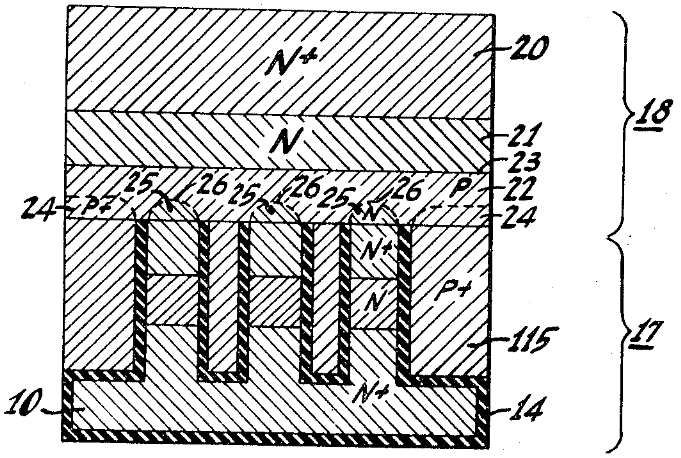

Referring now to FIG. 5, the base-collector e-collector assemblage 18 of FIG. 4 is positioned over the emitter assemblage 17 of FIG. 3d so that the layer 22 of the base-collector assemblage rests on the surface 16 of the high conductivity layer 115. The two assemblages are pressed together at a temperature of about 1050° to 1350° C., and a pressure of about 10 to 1,000 psi., for about 0.5 to 30 minutes. The two assemblages are thereby laminated and form a single monolithic block as illustrated in FIG. 5. During the lamination step, which is preferably performed in a vacuum or inert or reducing ambient, some of the acceptor conductivity modifier in the P+ crystalline layer 115 diffuses into the immediately adjacent portions of the P type layer 22, and forms P+ regions 24 therein. At the same time, some of the donor modifier present in portion 112 of each mesa diffuses into the P type layer 22, and forms N type emitter regions 25 therein. The N emitter regions 25 are separated by PN junctions 26 from the P type layer 22. The junction 23 between the P type base region 22 and the N type region 21 becomes the base-collector junction of the device, while each junction 26 becomes an emitter-base junction. The $N^+$ layer 20 helps form a good ohmic contact to the N type collector region 21. The $P^+$ polycrystalline layer 15 helps form a good ohmic contact to the P type base region 22. The $N^+$ wafer portion 10 helps form a good ohmic contact to all the mesas, and through them to the N type emitter regions 24.

Figure 6:
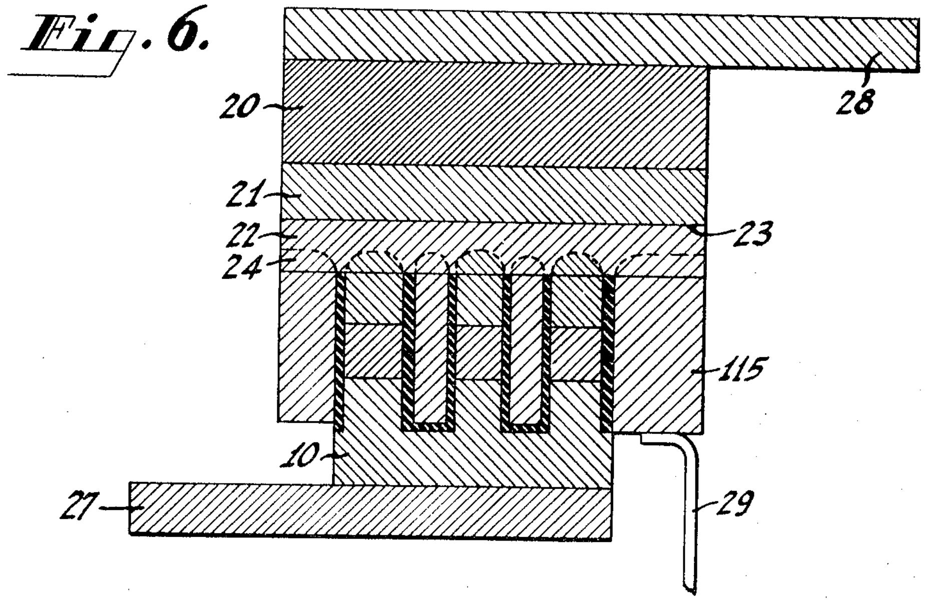

Referring now to FIG. 6, three electrical connections are made to regions 14, 115 and 20 respectively of the device by any convenient method. A peripheral portion of region 10, and the surrounding insulating coating 14, is first removed, for example by making and etching, or by ultrasonic grinding, to expose a peripheral surface region of the conductive layer 115. An emitter contact plate 27 is then bonded to the exposed surface of region 10, a collector contact plate 28 is bonded to the surface of region 20, and an electrical lead wire 29 is bonded to the exposed surface of region 115, for example by soldering. The emitter contact plate 27 and the collector contact plate 28 are sufficiently massive to provide not only mechanical strength to the device, but also improved thermal dissipation. Since heat sinking is thus obtained on two opposing sides of the device simultaneously, continuous operation of the device at high power levels is facilitated.

EXAMPLE II

In the previous example, a generally rectangular construction is shown. In the present example, a disc-shaped geometry is utilized.

Figure 7:
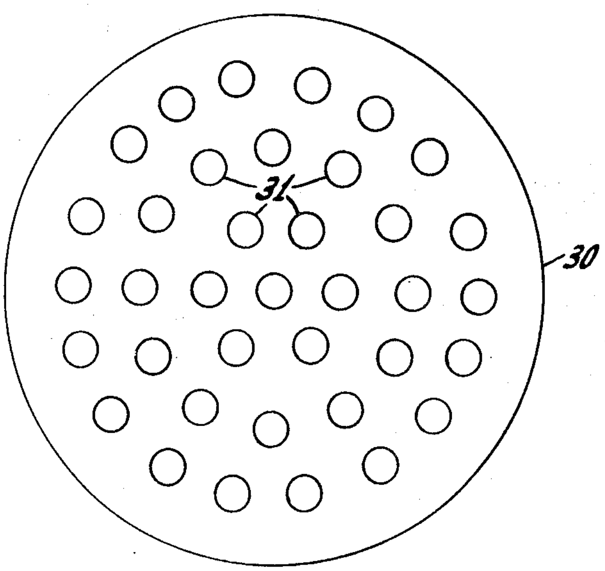
FIG. 7 is a plan view of an emitter assemblage according to another embodiment; and, FIGS. 8 and 9 are sectional views of semiconductive wafers during successive steps in the fabrication of a thyristor according to the invention.

Referring now to FIG. 7, a semiconductive body 30 is prepared in the form of a disc having a diameter of about 120 mils. The body 30 may consist of crystalline silicon, silicon-germanium alloys, germanium, III–V compounds, or the like, and has a sandwich structure consisting of a low resistivity layer, a high resistivity layer and a low resistivity layer, similar to that of layers 10, 11 and 12 in FIG. 1. A plurality of mesas 31, which subsequently become emitter columns, are formed by means of ultrasonic grinding in the face of body 30. The mesas 31 are similar to the mesas 13 of FIG. 2, in that each mesa 31 has a central portion of high resistivity material sandwiched between upper and lower portions of low resistivity material. These portions are not shown in the plan view of FIG. 7.

In this example, the semiconductive body 30 is provided with 37 such mesas, which are arranged in three concentric circles of 6, 12 and 18, respectively, around a central mass or emitter column. Each mesa 31 in this example has a circular cross section, and is about 7 mils in diameter. The remaining fabrication steps consist of depositing an insulating film over the upper surface of body 30 and over each mesa 31; depositing on the same surface a layer of low resistivity material (which consists of heavily doped polycrystalline silicon in this example); lapping the surface of the low resistivity layer until it is co-planar with the upper surface of each mesa 31; forming a base-collector assemblage with P type and N type layers similar to those of FIG. 4, but having a disc-shape with a diameter of about 120 mils; and then laminating the emitter assemblage and the base-collector assemblage to form a monolithic body.

In this example a peripheral portion of the semiconductor body 30 about 5 mils wide was removed by ultrasonic grinding to expose a peripheral portion of the base region. An emitter contact plate was bonded to the exposed face of body 30; a collector contact plate was bonded to the exposed face of the base-collector assemblage; and a base lead attached to the exposed peripheral portion of the base region.

Transistors fabricated as described in this example had a total emitter periphery of about 800 mils; exhibited a thermal resistance of about 0.45° to 0.8° C. per watt while continuously operating at power levers of about 125 to 220 watts; had a small signal power gain of 18 db at 20 MHz; and exhibited a frequency of oscillation cutoff ($f_{max}$) of 150 MHz.

Analysis of transistor design considerations indicates that it is desirable to fabricate transistors in such a configuration that, for a given geometry:

1. The thermal resistance of the unit is lowered without changing the area or the volume of the unit;
2. the base spreading resistance $r_b$, within the unit is decreased;
3. the high voltage capability of the unit is increased;
4. the resistance to second breakdown of the unit is increased; and,
5. the parasitic elements of the structure, particularly the emitter lead inductance of the finished device, is minimized In the laminated overlay transistor described in Examples I and II, all those objectives have been obtained. The active regions of the device are all placed in the central plane of the semiconductive body, whereas in conventional devices the active regions are generally at, or very close to, one surface of the semiconductive body. As a result of the configuration described herein, the heat generated in the device junction can be dissipated from two opposing surfaces of the unit. Both emitter contact and the collector contact are solid and continuous; relatively massive plates may be utilized to form these contacts, thereby improving heat dissipation and thermal capacitance. The advantageous features of the overlay transistor are retained, including a multiplicity of discrete emitter regions and a high ratio of emitter periphery to emitter area; and the provision of a ballast resistor in series with each emitter region improves the resistance of the device to second breakdown. The emitter contact may be connected directly to the ground plane of a circuit without the use of lateral metalization fingers and additional bonded leads

EXAMPLE III

Figure 8:
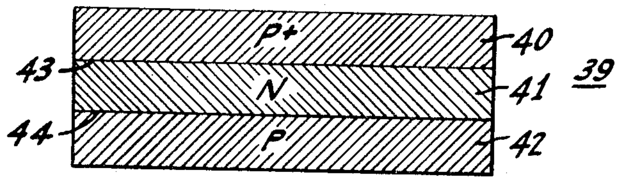

The principles of the invention are not limited to transistors, and may be applied to thyristors such as controlled rectifiers, and to multi-junction semiconductor devices generally. In this example, a first semiconductive assemblage such as the assemblage 17 is prepared as described in Example I in connection with FIG. 3*d*. A second semiconductive assemblage 39 (FIG. 8) is prepared comprising a $P^+$ monocrystalline semiconductive wafer 40; an N type semiconductive layer 41 on one face of wafer 40; and a P type semiconductive layer 42 on layer 41. The assemblage 39 may be fabricated by the successive deposition of an epitaxial N type and an epitaxial P type layer on one face of the wafer 40. Alternatively, the assemblage 39 may be fabricated by standard diffusion techniques.

Figure 9:
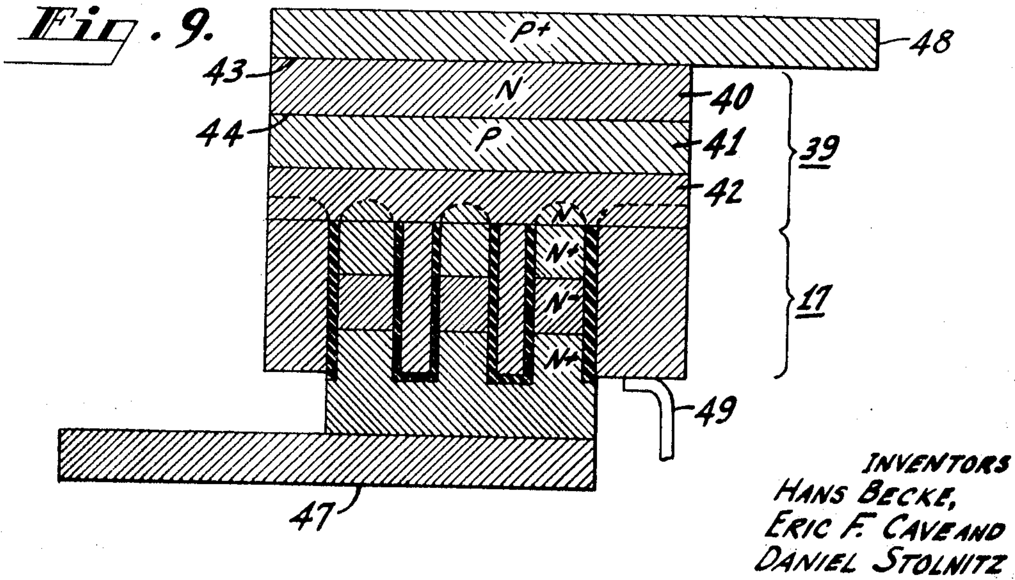

Referring now to FIG. 9, the assemblage 39 is positioned on the assemblage 17 so that surface 16 of assemblage 17 is in contact with layer 42 of assemblage 39. The two assemblages are then laminated by heat and pressure in an inert ambient as described in Example I to form a monolithic body. If the assemblage 17 is smaller than the assemblage 39, the PNPN structure of FIG. 10*b* is obtained at once. Preferably, assemblage 17 is made the same size and shape as assemblage 39, and after lamination, the edges of that portion of the monolithic body which was formerly assemblage 17 are removed by standard photolithographic masking and etching techniques, or by ultrasonic grinding. The subsequent steps of forming electrical connections 47, 48 and 49 to regions 10, 40 and 15 of the device, respectively, may be performed as described above in connection with Example I. In the operation of the device, $P^+$ region 40 is the anode; N type region 21 is the blocking layer; P type region 22 is the gate; $P^+$ region 15 forms a low resistivity ohmic contact to the gate region 22; and $N^+$ region 10 is the cathode.

The several embodiments described above are by way of example only, and not by way of limitation. Other crystalline semiconductive materials may be utilized, together with appropriate conductivity modifiers, and the conductivity type of the various device regions may be reversed. More complex structures such as bidirectional thyristors may be fabricated according to the invention. Various other modifications may be made by those skilled in the art without departing from the spirit and scope of the invention as set forth in the specification and the appended claims.

We claim.

1. The method of fabricating a semiconductor device comprising;

forming a plurality of mesas on one surface of a first semiconductive wafer;

forming an electrically insulating film on said one surface and on each said mesa;

depositing a layer of high conductivity material on said insulating film;

removing a surface portion of said high conductivity layer to expose the tops of said mesa;

positioning on said high conductivity layer a second semiconductive wafer which includes at least two layers of mutually opposite conductivity types; and, laminating said first wafer to said second wafer to form a monolithic semiconductive body.

2. The method of fabricating a semiconductor device comprising:

forming a plurality of mesas on one surface of a first semiconductive wafer of given conductivity type;

forming an electrically insulating film on said one surface and on each said mesa;

depositing on said insulating film a layer of high conductivity polycrystalline semiconductive material of conductivity type opposite to said given conductivity type;

removing a surface portion of said high conductivity layer to expose the tops of said mesas;

positioning on said high conductivity layer a second semiconductive wafer which includes at least two layers of mutually opposite conductivity types;

laminating said first wafer to said second wafer to form a monolithic semiconductive body; and, attached electrical leads to said body.

3. The method as in claim 2, wherein said first given conductivity type wafer comprises a layer of high resistivity material between two surface layers of low resistivity material.

* * * * *

UNITED STATES PATENT OFFICE

CERTIFICATE OF CORRECTION

-1-

Patent No. 3,659,334 Dated May 2, 1972

Inventor(s) Hans W. Becke, Eric F. Cave, Daniel Stolnitz

It is certified that error appears in the above-identified patent and that said Letters Patent are hereby corrected as shown below:

Daniel Stalnitz should read ---Daniel Stolnitz---.

IN THE TITLE:

Change "High Power, High Frequency Device" to ---Method of Fabricating a High Power, High Frequency Device---.

IN THE ABSTRACT:

Line 1, after "A" insert ---method of fabricating a---.

Line 8, after "conductivity" insert ---polycrystalline---.

IN THE SPECIFICATION:

Column 1, line 8, after "improved" insert ---methods of fabricating---.

Column 1, line 9, delete ---, and improved methods of fabricating them.---.

Column 2, line 61, delete "polycrystalline silicon layer 15" and insert ---the matrix of polycrystalline material 15---.

IN THE CLAIMS:

Claim 1, line 3, delete ---first---.

line 7, delete "layer of high conductivity" and insert ---matrix of polycrystalline---.

line 9, delete "high conductivity" and insert ---polycrystalline---.

UNITED STATES PATENT OFFICE
CERTIFICATE OF CORRECTION

Patent No. 3,659,334 Dated May 2, 1972

Inventor(s) Hans W. Becke, Eric F. Cave, Daniel Stolnitz

It is certified that error appears in the above-identified patent and that said Letters Patent are hereby corrected as shown below:

IN THE CLAIMS: (continued)

line 9, after "mesas;" insert ---and,---.

line 11, delete "positioning" and insert ---forming---.

line 11, delete "high conductivity" and insert ---polycrystalline---.

line 11, delete ---second---.

line 12, delete "wafer" and insert ---portion---.

line 13, delete ---mutually---.

line 13, delete ---;and,---.

line 14-15, delete ---laminating said first wafer to said second wafer to form a monolithic semiconductor body---.

Claim 2, line 7, delete "layer of high conductivity" and insert ---matrix of---.

line 10, delete "high conductivity layer" and insert ---matrix and of said film---.

line 12, delete "positioning on" and insert ---joining to---.

line 12, delete "high conductivity layer" and insert ---matrix---.

ORM PO-1050 (10-69)

USCOMM-DC 60376-P69
☆ U.S. GOVERNMENT PRINTING OFFICE : 1969 O—366-334

UNITED STATES PATENT OFFICE

CERTIFICATE OF CORRECTION

Patent No. 3,659,334 Dated May 2, 1972

Inventor(s) Hans W. Becke, Eric F. Cave, Daniel Stolnitz

It is certified that error appears in the above-identified patent and that said Letters Patent are hereby corrected as shown below:

IN THE CLAIMS: (continued)

Claim 2, line 15, delete ---laminating said first wafer to said second wafer to form a monolithic semiconductive body---; line 17, delete ---attached electrical leads to said body---.

Signed and sealed this 17th day of October 1972.

(SEAL)
Attest:

EDWARD M.FLETCHER,JR.
Attesting Officer

ROBERT GOTTSCHALK
Commissioner of Patents